United States Patent [19]

Izraelev

[11] Patent Number: 5,212,388
[45] Date of Patent: May 18, 1993

[54] METHOD FOR DETECTING TRACKING ERROR IN MAGNETIC TAPES WITH USING AN X-Y STAGE CALIBRATION MEANS

[75] Inventor: Valentin M. Izraelev, Eden Prairie, Minn.

[73] Assignee: Minnesota Mining and Manufacturing Company, St. Paul, Minn.

[21] Appl. No.: 877,830

[22] Filed: May 1, 1992

[51] Int. Cl.⁵ .............................................. G01V 9/04
[52] U.S. Cl. ..................................... 250/560; 250/570
[58] Field of Search ............... 250/560, 561, 570, 216; 369/44.14, 44.26, 44.11, 44.41; 350/137, 77.12-77.17

[56] References Cited

U.S. PATENT DOCUMENTS

| | | | |
|---|---|---|---|
| 3,715,524 | 2/1973 | Adler | 250/570 |
| 3,721,809 | 3/1973 | Strandberg, Jr. et al. | 250/560 |
| 4,947,050 | 8/1990 | Kennedy | 250/570 |

Primary Examiner—David C. Nelms
Assistant Examiner—Que T. Le
Attorney, Agent, or Firm—Gary L. Griswold; Walter N. Kirn; Warren R. Bovee

[57] ABSTRACT

A method and apparatus for analyzing tracking errors in magnetic tape. The apparatus and method allow for distinguishing between those errors in track configuration due to rotational errors (i.e., errors deriving from rotation of the head wheel of a recording and/or reading machine) and errors in track configuration due to other sources of error. An apparatus useful to practice the method holds a magnetic tape in a condition useful for examining the magnetic tape to measure the configuration of recorded tracks on the recording surface of the tape. The apparatus includes means for applying and maintaining a selected tension to the longitudinal and cross-web axes of the tape, a planar measuring surface having X and Y measuring scales allowing for measurement of distances between selected points on the recording surface of the tape, and a microscope or other sensing device for examining the recording surface. Also disclosed is a calibration method allowing for determining corrected distances between selected points on the tape surface with the disclosed apparatus.

3 Claims, 3 Drawing Sheets

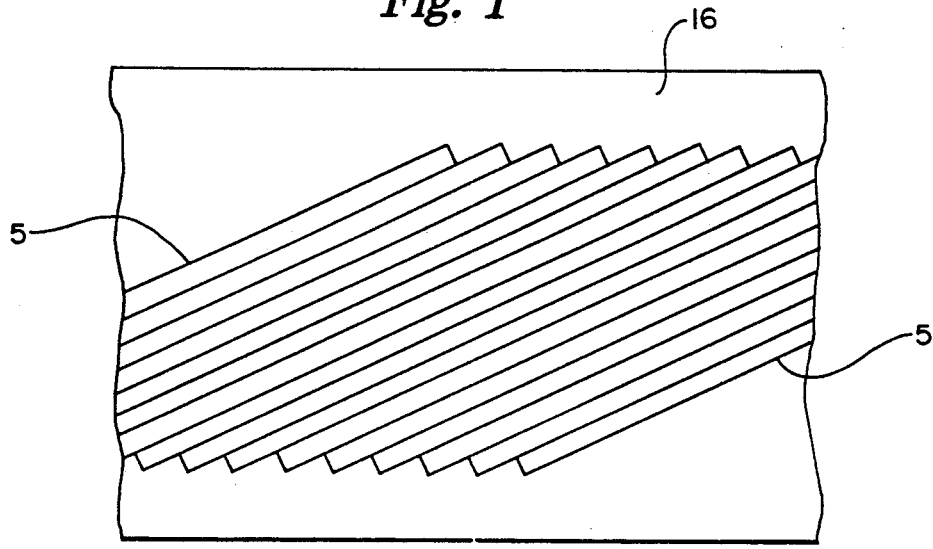
Fig. 1
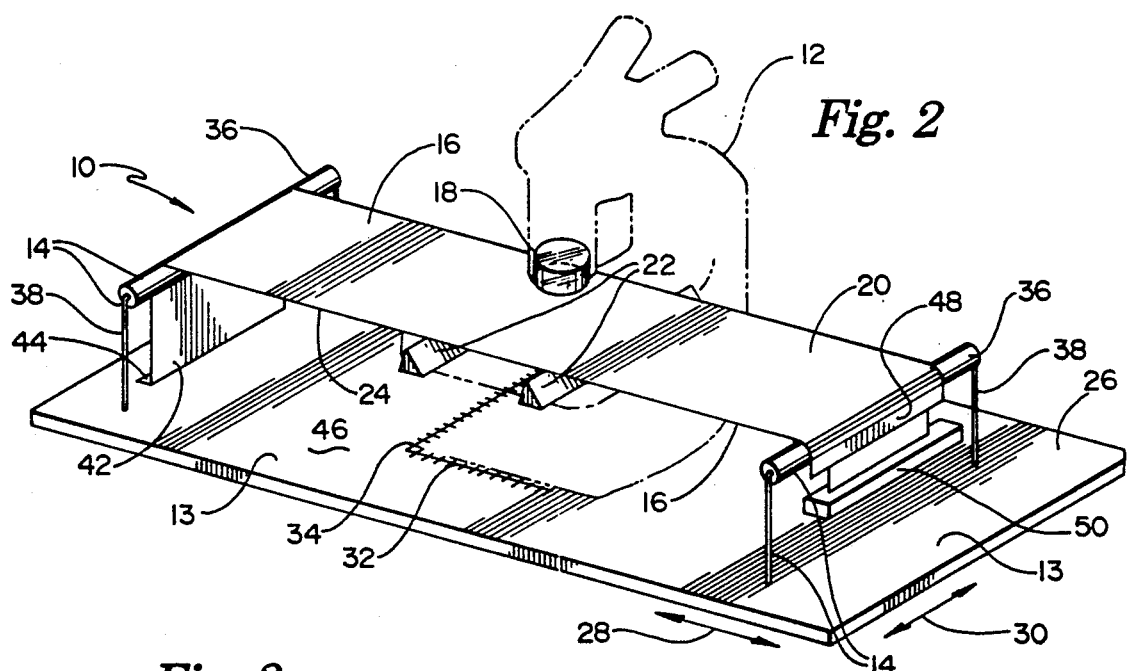
Fig. 2
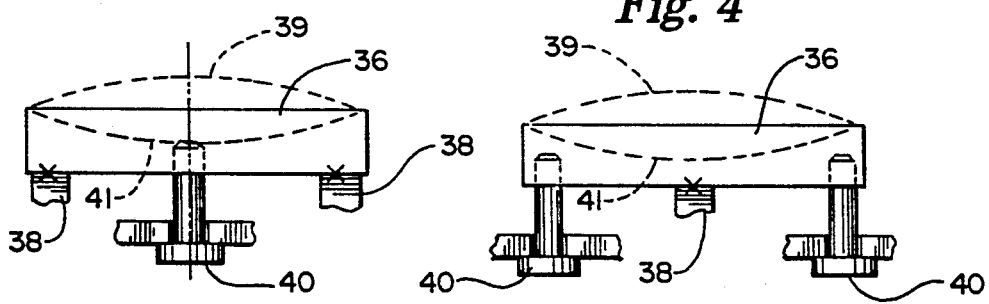
Fig. 3
Fig. 4

METHOD FOR DETECTING TRACKING ERROR IN MAGNETIC TAPES WITH USING AN X-Y STAGE CALIBRATION MEANS

TECHNICAL FIELD

The present invention relates to a method and apparatus for measuring tracking errors in magnetic tapes used for storage of information in electronic formats. More specifically, the present invention relates to a method for differentiating rotational from non-rotational components of errors in such tapes and an apparatus and calibration method allowing for microscopic examination and accurate determination of distance parameters associated with tracks on the surfaces of magnetic tapes.

BACKGROUND OF THE INVENTION

Magnetic tape has been used successfully for many years to store audio, video, computer and other forms of information. A primary goal in the magnetic information storage industry has been that of increased efficiency of storage, i.e., placement of increasingly larger amounts of information on progressively smaller areas of the recording medium. A packing density of 40,000 or more bits per inch of track length has been achieved, and 100,000 or more bits per inch of track length is envisioned for magnetic tapes in the 1990's and beyond.

Modern magnetic tapes generally consist of a polyethylene-terephthalate (PET) film base on which a magnetic material such as cobalt-modified gamma-ferric oxide, generally as a fine powder dispersed in a plastic binder, is deposited on the PET film surface. Information is stored on such tapes as a series of magnetized and unmagnetized domains arranged in a pattern of specific tracks in the magnetic coating. The patterns of magnetized and unmagnetized domains within tracks are established by passing the tapes in proximity to transducers, or "heads," that magnetize the magnetic particles in the tape coating. Analogous transducers may be used to read the pattern of magnetic signals recorded on the tape. A "read" head converts magnetic signals on the tape into electrical signals, and a "write" head converts electrical signals into magnetic signals when recording information on a magnetic tape. So-called "read/write" heads combine these two functions in one structure.

A drive apparatus is required to move the magnetic tape past the read and write heads at a controlled speed and with a minimum of lateral variation in tracking. "Tracking" refers to the proper alignment of the tape with the read and write heads to ensure continuous association of a particular track with the head during the read or write operation. The requirement for consistent tracking is particularly critical in preferred high density applications wherein a plurality of relatively narrow parallel or otherwise congruent tracks with high bit densities are utilized.

Refinements for increased recording efficiency in high density tape applications have involved the use of progressively narrower tracks and progressively smaller spaces between tracks. With helical drives, one or more rotating magnetic heads engage a tape wrapped at least partially around a cylindrical member such that the tape path describes a portion of a helix. Tracks generated by the heads in a helical drive thereby track diagonally across the tape. Generally, the recorded tracks lie at an angle substantially less than 45 degrees with reference to the longitudinal axis of the tape. The space between the centerlines of two adjacent tracks generated by "helical drives," for example, may be as small as about 12 micrometers.

In general, the combination of a moving tape with a spinning head wheel provides a more rapid recording and read-out of information than is possible with movement of tape past a stationary head wheel. Given the desirability of a spinning head wheel, the geometry of helical drives and resultant diagonal tracking across the tape allows for more efficient utilization of the surface area of the tape than is possible with non-helical drives.

In one typical helical drive configuration, four read/write heads are mounted on a scanning head wheel that is rotated as the tape passes the recording or reading areas of the heads. Each of the four heads is separated from its neighboring heads by 90 degrees on the head wheel. Rotation of the head wheel and movement of the tape is adjusted such that when the preceding head is on the middle of the track length (that is, in the middle of the tape width), the following head is on the beginning of its track. In other words, one half of the track represents one-fourth of the head wheel revolution.

A representative arrangement of parallel, diagonally oriented tracks produced by a helical drive is depicted schematically in FIG. I. The diagonal tracks 5 are generally confined to a central area on the surface of the tape 16, as depicted in FIG. 1. The lateral margins of the tape may be reserved for various forms of reference data, such as cue tracks, audio controls and time codes.

Given the ability to record information on large numbers of congruent tracks having very small centerline-to-centerline separations, it is possible to pack large amounts of information on relatively small areas of tape. On the other hand, such high packing densities mandate great accuracy in any tape drive mechanism having the task of precisely aligning the directional movement of read and write heads with individual tracks. Even slight deviations of the read/write head from the two-dimensional orientation of an individual track may cause the position of the head to overlap onto an adjacent track. The result is that information on adjacent tracks is read inappropriately as "noise" superimposed on the information readout from the correct track. This can lead to partial or even complete loss of the information readout from the magnetic tape.

Helical recorders will generally stress the tape on the input and output guides so that a bias is created that forces the tape to rest firmly on the bottom edge guides. This is required to maintain the tight tolerance required by the narrow helical recorded tracks. Hence, when tapes recorded on helical recorders are viewed with uniform longitudinal stress, the tracks will be curved. This indicates the differential non-uniform stress that the tape was subjected to during the recording.

Tracking errors due to misalignment of the read/write heads with the tracks on a magnetic tape are minimized when the same read/write heads and the same drive mechanism are used to read the tape as were used to record on the tape. For example, the track laid down by a read/write head may be slightly out of line or otherwise imperfect due to mechanical imperfections in the drive and/or head wheel structure. Nevertheless, if the very same drive/head wheel structure is used to read the tracks as was used to record the tracks (assuming the same mechanical imperfections are present in each operation), the same pattern of tracking errors as were produced in the "write" or record mode may be duplicated in the "read" mode. In other words, if the same head wheel and drive are used in both operations, the read heads likely will be able to follow individual recorded tracks without deviating onto adjacent tracks. The result would be a correct "read" of the information on the magnetic tape in spite of inherent tracking errors.

On the other hand, tracking errors during recording may lead to substantial or even catastrophic loss of information if the tape is run in a machine that is unable to duplicate the original track configurations. For example, tracking errors may arise from differing manufacturing tolerances in alignments of the tape drives and scanning head wheels of different machines. Even with the same machine, field use and changes in stability of the drive and scanning mechanisms over time may render magnetic tapes previously produced by the machine to be "unreadable" at a later date. Moreover, magnetic tapes themselves may undergo deformation due to stretching, aging, temperature changes, humidity changes and other variables, irrespective of structural variation in the recording/reading machines.

SUMMARY OF THE INVENTION

It is desirable to have means for standardizing the tracking parameters of magnetic tape recording and reading machines. For example, it is desirable to read magnetic tapes that have been stored for years or even decades. In such cases, machines originally used to record data on such magnetic tapes may be unavailable, and the tapes will need to be read with completely different machines. Even if the same machine is available, however, aging of the magnetic tape, machine structural changes or other variables as discussed above may have caused the original track configuration to be altered. The machine used to read the magnetic tapes, even though it may be the same machine used originally to record the information, may need to be recalibrated.

Calibration may be accomplished through use of a standard reference structure providing known track configurations. Such a reference structure may be provided by a "calibration tape," for example. A calibration tape consists of a magnetic tape having magnetic tracks of known configuration. Preferably the tracks on such a calibration tape will be of a configuration as close to the "ideal" configuration (i.e., perfectly linear tracks, perfectly uniform distances between tracks, and perfectly uniform orientation of the tracks in relation to the longitudinal axis of the tape) as is possible with extant technology.

Thus, a reading and writing machine may be calibrated by having it read the information on the calibration tape. The drive, head wheel or other components of the machine are then adjusted until the received information output from the calibration tape is of acceptable quality. The information output, for example, may consist of a simple audio frequency in which any deviation of the read/write head from an individual track onto adjacent tracks causes a readily detectable decrease in the signal-to-noise ratio. The machine may be adjusted until the signal-to-noise ratio is at an acceptable level.

Production of a useful calibration tape requires an apparatus and method for measuring deviations from the "ideal" parameters of linearity, uniformity of between-track distances, and uniformity of track orientation. In an analogous fashion, when reading an old or otherwise physically distorted tape, it also may be necessary to measure and characterize the tape tracking errors. This would provide insight into the necessary machine adjustments required for meaningful reading of the tape.

It would be desirable in any system for measuring tracking errors to be able to differentiate various sources of error and to correlate such errors with particular drive, tape or scanning components. With helical drive systems utilizing spinning head wheels, for example, it is quite possible for the head wheel to be "out-of-round," prone to wobbling, or otherwise defective in its rotation about an axis. Such a spinning head wheel would tend to generate the same type and magnitude of tracking error with each revolution or set of revolutions about its axis of revolution. Those errors due to an "out-of-round" condition, for example, might manifest themselves on the tape as repeating errors corresponding to individual revolutions of the head wheel. Other defects in rotation of the head wheel, such as wobbling, might manifest themselves as repeating errors that correspond to individual revolutions or to repeating units of multiple revolutions, depending on the complexity of harmonic variations present in the head wheel rotation.

Errors unrelated to rotation of the head wheel may arise from "crossweb" (i.e., across the width of the tape) or longitudinal distortions in the tape, from slippage of the tape in or around the tape drive components, or from other variations in mechanical or environmental (e.g., temperature, humidity) parameters.

Any system of error analysis allowing errors due to head wheel rotation (rotational error) to be distinguished from other forms of error (nonrotational error) would provide at least a partial diagnosis of the source of the error. For example, identification of a tracking error as consistent with rotational error correspondingly implicates the head wheel and its rotational mechanism as the source of error. This greatly simplifies efforts directed at correcting the problem, thereby creating significant savings in human and machine resources and ultimately allowing production of higher quality machines and magnetic recordings.

The present invention comprises a method for detecting periodic errors in tracking due to head wheel rotation and identifying errors due to other factors. Using the apparatus and method of X - Y stage calibration as described below, the true distances between corresponding fixed locations (e.g., longitudinal midline) in adjacent tracks on a magnetic tape are determined. The number of tracks so examined should correspond to a set of tracks representing one or more cycles of head wheel rotation. Having obtained estimates of the true distances between fixed locations on such a set of adjacent tracks, a matrix of equations may be derived that allows calculation of the tracking errors due to rotation of the head wheel as well as errors due to other factors.

The invention also comprises a novel method of X - Y stage calibration such that an estimate of the true distance between any two points on the surface of the stage may be determined by examination with the sensing device. A source of standard distance units is provided on the surface, each distance unit defining a standard distance between a first point and a second point. Each standard distance unit is compared to a corresponding distance between the first and second points as defined by X - Y coordinate readings, taken from observations of the X axis and Y axis measuring scales with an appropriate sensing device, at each point. These comparisons allow error parameters to be determined at a plurality of points on the surface of the X - Y stage under examination.

The apparatus in accordance with the present invention broadly comprises structures for holding a magnetic tape in a predetermined configuration and under a predetermined longitudinal tension. A first apparatus holds the tape in a manner that maintains a uniform tension profile across the width of the tape so that if it is imagined that the tape consists of a multiplicity of parallel strands, the longitudinal tension on each strand is equal. The tape held in this manner is encouraged to lie in a natural straight configuration. A second apparatus holds the tape with a predetermined non-uniform tension profile across the width of the tape so that the imaginary strands will have unequal tension. A tape held in this manner will be encouraged to deviate from a natural straight configuration, and it will simulate the stress characteristics experienced in a recording machine due to non-frictional effects as the tape traverses a head wheel.

The first apparatus further includes a means of holding the tape in a demobilized manner and in a flat plane suitable to maintaining the surface of the tape within the focal plane of an optical microscope or other close spaced sensing device that is employed to examine the tape surface by moving the tape, or conversely by moving the microscope or sensing device over the surface of the tape.

The apparatuses for holding a magnetic tape are coupled to an X - Y stage moveable along a first, or X, axis and along a second, or Y, axis perpendicular to the X axis. The apparatus of the present invention further includes a sensing device, preferably a microscope lens or other optical magnifying means, placed in relation to the X - Y stage to provide for visual examination of the tracks on the magnetic tape. The sensing device also may be movable in the X and Y axes.

The X - Y stage includes an X axis measuring scale and a Y axis measuring scale for measuring the distance moved by the stage (and tape) as the stage is moved in the X or Y directions, or for measuring the distance moved by the sensing device as the sensing device is moved in the X or Y directions. The apparatus further includes means for maintaining a predetermined tension level and profile as the tape is examined with the sensing device.

The structure for holding the tape includes tape guides for supporting the tape and for imparting differential stresses to the tape as it is scanned by the sensing device. The tape guides may be adjusted to remain in a flat or in a variety of curved orientations, with the curved orientations serving to generate non-uniform cross-web stresses as the tape is stretched in the longitudinal direction. That is, the stresses along the longitudinal axis of the tape may differ between the mid-line and lateral edges of the tape as the result of differential stresses emanating from the curvature of the tape guides.

The structure for holding the tape further includes a weight, biasing spring or other means for generating tension along the longitudinal axis of the tape. In combination, the tape guides and tension-generating means allow the tape to be placed under predetermined stress conditions that simulate the tension experienced by the tape in machine operation.

Means for maintaining the tape under predetermined stress conditions comprise tape biasing supports interposed between the tape guides. The tape biasing supports flatten the tape allowing for optimum examination within the potentially narrow parameters for depth-of-focus of the sensing device. At the same time, the tape biasing supports permit the cross-web and longitudinal stresses generated by the tape guide-imparted configuration to be transmitted to the tape under examination. In an alternative embodiment, a porous substrate through which a suction is maintained keeps the tape in the desired conformation for examination.

DESCRIPTION OF THE DRAWINGS

FIG. 1 is a schematic depiction of diagonal tracks on a standard tape;

FIG. 2 is a schematic, perspective view of the apparatus of the present invention;

FIG. 3 is a fragmentary, elevational view of the tape guide of the present invention with adjustment mechanism;

FIG. 4 is a fragmentary, elevational view of an alternative embodiment of the tape guide and adjustment mechanism.

DETAILED DESCRIPTION

Figure 5:
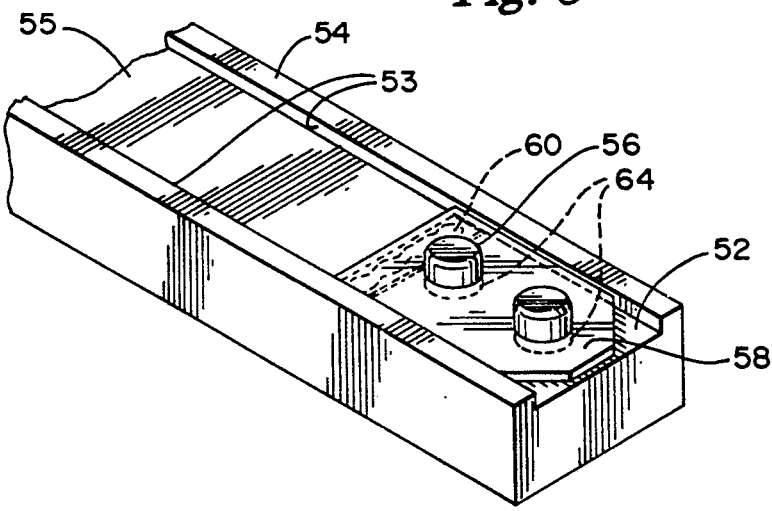
FIG. 5 is a fragmentary, perspective view of a tape-compatible groove and a magnetic tape presenting triangular plastic tabs for attachment to a stretching device.

FIG. 1 shows a magnetic tape 16 with diagonal magnetic recording tracks 5.

FIG. 2 shows an apparatus 10 in accordance with the present invention broadly comprises a stationary base 12, an X - Y stage 13 and a support system 14 for holding the magnetic tape 16 under tension.

The stationary base 12 may be of any suitable size and configuration allowing for attachment of a sensing device and other structures of the invention. The stationary base 12 must be of sufficient size and stability to operably support such structures above the X - Y stage. As such, the stationary base 12 should be capable of preventing or absorbing vibrational interference with the sensing device and other structures.

The sensing device is preferably a microscope lens tube 18 attached to the stationary base 12, in this case the supporting structure of an optical microscope as depicted in FIG. 2. The lens tube 18 is placed above the tape 16 for observation of the upper surface 20 of the magnetic tape 16 as depicted in FIG. 2. In one configuration of the tape tensioning device, a pair of tape supports 22 is coupled to the stationary base 12. The tape supports 22 are adapted to contact and support the magnetic tape 16 at its lower surface 24. The tape supports 22 are movable between a first position as depicted in FIG. 2 and a second position (not shown) in which the tape supports 22 are disengaged from the magnetic tape 16 and removed from proximity to the lower surface 22 of magnetic tape.

The X-Y stage 13 is movable in the X and Y directions, 28 and 30, respectively, as depicted in FIG. 2. The X-Y stage is fitted with an X direction measuring scale 32 and a Y direction measuring scale 34. Movement of the X-Y stage in the X and Y directions may be driven by manually operated turning screws or by other mechanisms known to those skilled in the art.

In an alternative embodiment, the microscope lens tube 18 itself may be coupled to a platform movable in the X and Y axes. The platform may have measuring scales analogous to those described above for the X-Y stage. In this embodiment, movement of the sensing device (e.g., the lens tube 18), rather than movement of the X-Y stage, is measured. In all other respects, the relative movements as described below are equally applicable to movement of the X-Y stage in the X and Y axes or to movement of the sensing device, via the sensing device platform, in the X and Y axes.

Tape guides 36 are coupled to the X-Y stage by means of supports 38. The tape guides 36 may be manufactured of a flexible material allowing for bending of a tape guide 36 along its longitudinal axis with simultaneous spatial distortion of the overlying tape 16 in the cross-web direction. Various means for adjusting the orientation of the tape guides 36 may be employed in the present invention. For example, adjustment screws 40 for creating selected flexures of the tape guides 36 may be placed at the middle or at the ends of the tape guides 36, as depicted in FIGS. 3 and 4, respectively. Upward or downward adjustment of a particular screw 40 leads to a corresponding upward or downward positioning of that portion of the tape guide 36 engaged with that screw 40 as shown by dotted lines 39 and 41, respectively. In this manner, selected adjustments to specific regions along the longitudinal axis of the tape guides 36 are accomplished. Corresponding selected cross-web distortions of the tape 16 follow from such adjustments.

A first end 42 of the magnetic tape 16 may be attached at point 44 to the upper surface 46 of the X-Y stage 13. The attachment may be accomplished by clamping across the entire width of the end 42, or may be accomplished by attaching the tape end 42 at one or more defined points to the X-Y stage 13. The opposed end 48 of the magnetic tape 16 may be coupled to a hanging load 50 of desired weight, providing tension on the magnetic tape 16 as the tape passes over the tape guides 36.

The tape supports 22 function to maintain a flat, planar configuration of the magnetic tape 16 regardless of the edge-to-edge bias imparted to the tape by various degrees of longitudinal bending of the tape guide supports 38. Thus, the magnetic tape 16 may be stretched in a biased or unbiased mode and nevertheless immobilized in a flat configuration for viewing.

A preferred method and apparatus for preparing a tape sample with a uniform tension profile comprises the use of a jig 54, which is shown in FIG. 5. A segment of tape 55 is placed in the jig 54 which is configured as a shallow flat trough 52 having raised edges wherein the internal surfaces of the edges 53 are spaced by a distance equal to the width of the tape. The raised edges confine the tape within the straight configuration of the jig. Registration pins 56, 57 of accurate diameter and location protrude above the floor of the trough at opposite ends of the trough and are centered precisely in the trough. Employing a hypodermic needle or other suitable application device, a thin line of photo-activated, polymeric adhesive 60 is applied to the surface of the tape across the width of the end of the tape sample in the vicinity of the pins. A triangular shaped transparent plastic tab 58 having accurately dimensioned holes 64 at the apex of the triangle is then placed over the pins centered in the trough so that the base side of the triangle overlaps the tape end and the adhesive applied thereto. With the tape end and the underside of the triangle wetted with adhesive, ultraviolet radiation is directed through the clear plastic of the plastic tab 58 to the adhesive between the tape and tab, causing the adhesive to bond the tape and tab to each other. The opposite end of the tape sample is prepared in a similar manner.

Figure 6:
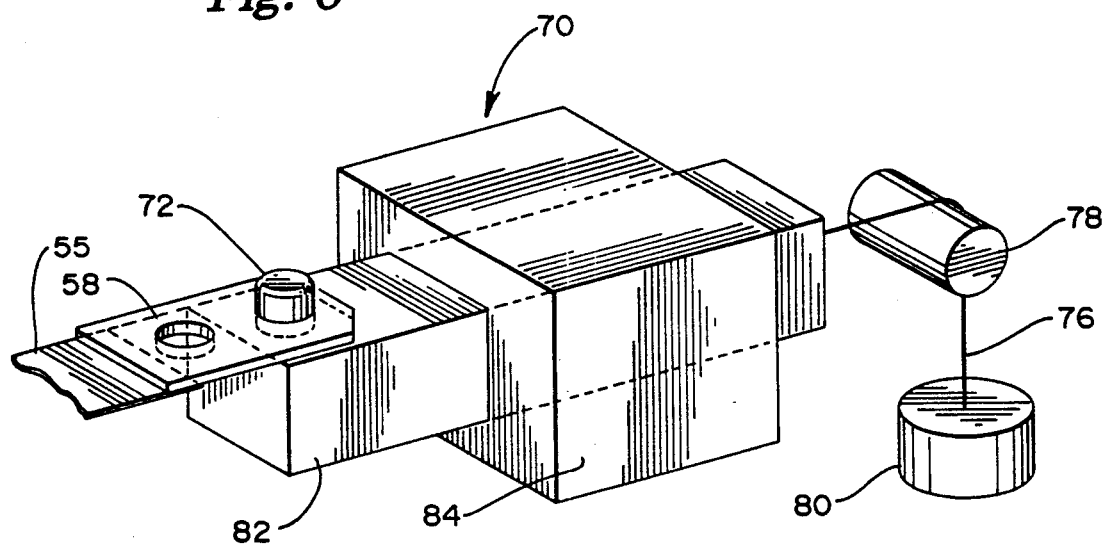
FIG. 6 is a perspective view of a stretching device for engaging a tape with attached triangular plastic tabs.

The tape 55 and attached plastic tabs 58 can be removed from the jig 54 and placed into a tensioning device such as shown in FIG. 6. The tensioning device comprises a stationary support and pin to engage one end of the tape 55 and a tensioning element 70 that has a pin 72 placed in a hole in the plastic tab 58 at one end of the tape, thereby supporting both ends of the tape. The pin on the end of the tensioning device not shown is rigidly affixed to the structural members of the device. The pin 72 at the opposite end is mounted to a slide 82 that has freedom to move in a longitudinal direction to apply tension to the tape sample 55. Means 84 is employed to hold the tape horizontally from edge to edge by preventing the pin and slide from rotating about an axis that is parallel with the edge-to-edge plane of the tape sample, and further preventing the tape sample from twisting. A thin, flexible cable 76 is attached to the slide 82 that holds the pin 72. The cable 76 changes from a horizontal orientation to a vertical orientation by passing over a low friction bearing 78, and a calibrated weight 80 is attached to the free end of the cable. The weight pulls the cable, the slide that supports the pin, the pin, and the end of the tape.

Figure 7:
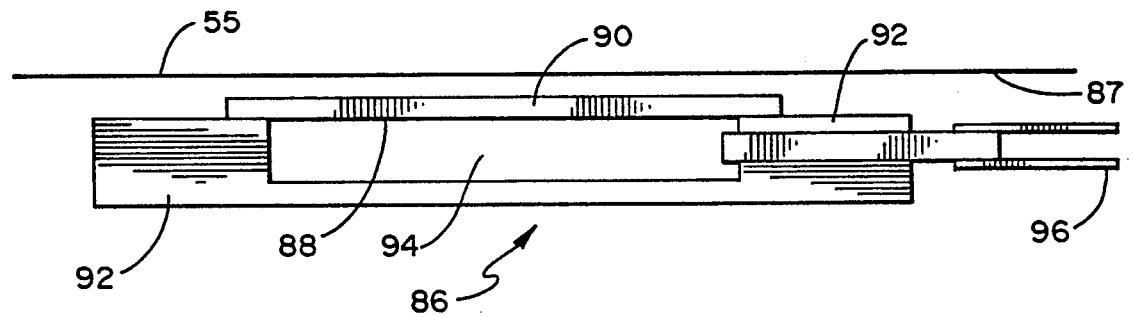
FIG. 7 is a perspective view of a tape-immobilizing apparatus of the present invention.

The triangular plastic tabs 58 attached to the ends of the tape are free to rotate about the axis of the pins over which they are placed thus relieving any differential tension on the tape from edge-to-edge, and allowing the tape to assume a natural extended shape under calibrated tension. With the tape thus extended, a platen 86 is brought upward vertically underneath the tape as shown in FIG. 7 until parallel contact between the underside tape surface 87 and the upper surface 90 of the platen is made. The platen consists of a length of porous glass 88 (for example, porous Pyrex glass) that forms the surface of the platen and one wall of a rectangular hollow chamber 94. The remaining walls 92 of the chamber 94 are impervious to air. Air is pumped from the chamber, causing air to flow downward through the pores of the glass, causing the tape 55 to be pressed against the porous glass by atmospheric pressure. Air pressure thus immobilizes the tape sample to prevent subsequent movement or slipping over the surface of the platen, and air pressure holds the tape flat against the platen so that the surface of the tape lies in a single flat plane. With vacuum continuously applied through a flexible hose or coupling 96, the platen and tape sample are now free to be moved to the surface of the X-Y stage where recorded features on the tape surface can be geometrically precisely measured.

Dust particles which may reside between the tape and Pyrex sheet 88 can cause distortion of the tape. As a preparation step in following the above procedure, dry nitrogen can be forced at low pressure into the chamber 94 of the holding device 86, causing any dust particles on the Pyrex sheet surface 90 to fly off that surface, thus cleaning the surface 90 of foreign particles prior to attaching the tape.

An alternate method of handling the tape comprises a procedure whereby the tape is merely extracted from a cartridge as a loop. Any suitable fixture may be used to hold the loop of tape while the tabs 58 are cemented at points on the tape equal to the length of a cut sample as described above. Following attachment of the tabs 58, the tape may be handled as described above. The tabs 58 may be removed from the tape after testing by gentle peeling without damaging the tape. In this way, tests may be run on tapes that are recorded with information that cannot be discarded. Such tape samples can be successively removed and reattached to the holding device 86 and X- Y positioning mechanism (e.g., X - Y stage 13) with identical measurements obtained in each test. Not only can tape samples be reattached, but they can be reversed end for end without showing any positioning error.

Prior to examination of tracks in a magnetic tape, the X - Y stage or, in the alternative, an X - Y platform allowing for X axis and Y axis movement of the sensing device, must be calibrated. This is necessary due to the inevitable manufacturing errors and imperfections present in any X - Y stage or sensing device platform and associated mechanisms of movement.

Figure 8:
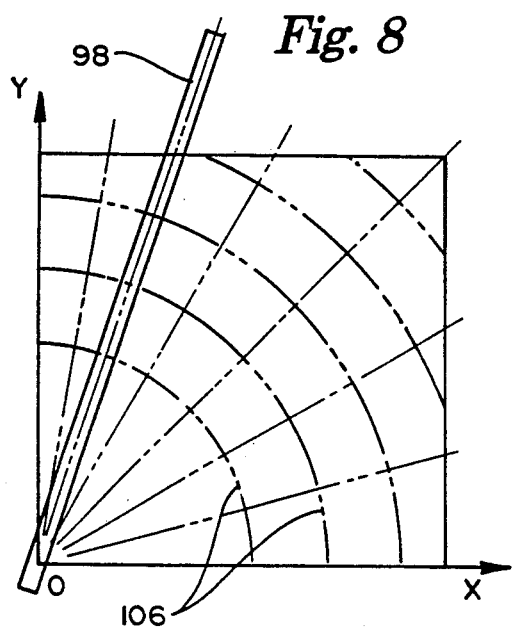
FIG. 8 is a schematic top plan view of a portion of an X - Y stage with associated step gage.
Figure 9:
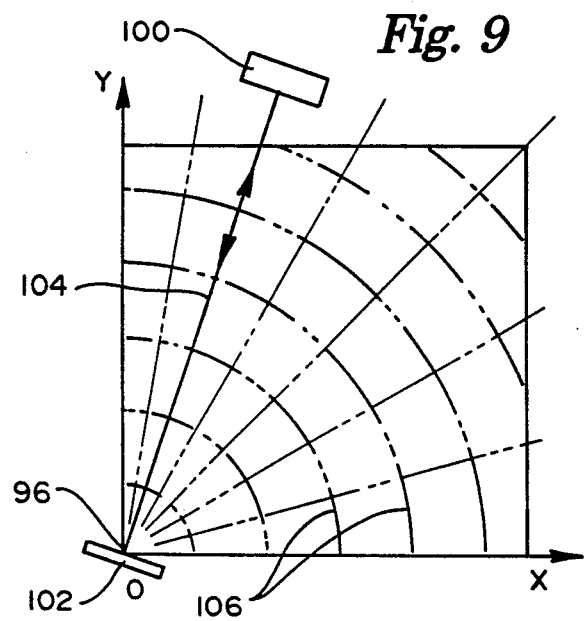
FIG. 9 is a schematic top plan view of a portion of an X - Y stage with associated laser interferometer and mirror.

Calibration may be accomplished in the following manner. In an orientation as would be encountered by an observer looking through the microscope 18 shown in FIG. 2, a point of origin 96, as depicted in FIGS. 8 and 9, is established in the lower left portion of the microscope 18 field of view. A step gauge 98 (FIG. 8), or a laser interferometer 100 with associated mirror 102 (FIG. 9), is used as a source of standard distance units, $R_{ij}$ (std), emanating from the point of origin 96 as depicted in FIGS. 8 and 9. The stage 13, or microscope lens tube 18, is moved from the point of origin 96 to a point corresponding to the first standard distance unit along the step gauge or laser interferometer path 104. At this location "$X_i$" and "$Y_j$" readings are taken. The error $E_{ij}$ at the point (i, j) is the difference between the standard distance unit and the distance between the origin and the point (i, j) as defined by the "$X_i$" and "$Y_j$" readings at the point (i, j). Thus, the error $E_{ij}$ may be defined as follows:

$$E_{i,j} = R_{i,j}(\text{std}) - |\sqrt{X_i^2 + Y_j^2}| \quad (1)$$

where $E_{i,j}$, $R_{i,j}$(std), $X_i$ and $Y_j$ are defined as above.

In the same way, errors in X - Y stage measured distances may be determined at each point corresponding to standard distance units along the step gauge or laser interferometer pathways. By rotating the step gauge 98 or laser interferometer 100 and mirror 102 in selected angular intervals 106 about the origin as depicted in FIGS. 8 and 9 and repeating the error measurements at each step as described above, the pattern of errors over the surface of the X - Y stage or sensing device X - Y platform may be mapped. This allows for compilation of a look-up table listing all of the calculated error functions associated with selected points on the X - Y stage or sensing device X - Y platform. For points located between the calibrated points as defined above, one of the standard interpolation methods as known in the art may be used.

Having calibrated the X - Y stage or sensing device X - Y platform, it is then possible to determine the corrected distance between any two points whose position is determinable by reference to the X, Y coordinates of the X - Y stage or sensing device X - Y platform. The corrected distance between such points is defined as follows:

$$d^*_{1,2} = \left( (d_1 + E_1)^2 + (d_2 + E_2)^2 - 2\left( \left(X_1 + E_1\frac{X_1}{d_1}\right)\left(X_2 + E_2\frac{X_2}{d_2}\right) + \left(Y_1 + E_1\frac{Y_1}{d_1}\right)\left(Y_2 + E_2\frac{Y_2}{d_2}\right) \right) \right)^{\frac{1}{2}} \quad (2)$$

where: $d^*_{1,2}$ is the corrected distance between points 1 and 2;

$d_1$, $d_2$ are the measured distances from points 1 and 2 to the origin, respectively;

$E_1$, $E_2$ are the errors at points and 2 respectively (obtained from the calibration look-up table); and $X_1$, $X_2$, $Y_1$, $Y_2$ are the coordinates of points 1 and 2 respectively.

It is common for manufacturers of X - Y measuring stages and platforms to certify accuracy and repeatability for measurements along each axis. This, however, is not a total measure of the accuracy of the entire system (i.e., accuracy of the complete mechanical and sensing mechanisms). Such error estimates provide only an estimate of the error for translations coinciding with the directions of the single X or Y scales. The so-called "Abbe's error," for example, occurs when the measured distance between two points does not coincide with the axes defined by the X and Y direction measuring scales. For example, the X - Y stage, because of inevitable mechanical tolerances, is at least partially rotatable around some point. Such a rotation would engender an actual displacement under the microscope, but would not be reflected by a change in the X and Y readings taken at a given point. If the distance between two points on an X - Y stage is measured using the apparatus and methods of the present invention as described above, and if $$|E_{i,j}| > |(\Delta X_{is}^2 + \Delta Y_{js}^2)^{\frac{1}{2}}| \quad (3)$$

where $E_{i,j}$ is defined as above, and $\Delta X$, $\Delta Y$ are the errors of the X and Y scales respectively (as specified by the manufacturer or otherwise determined), then there is a significant contribution from Abbe's error.

The novel method of X - Y stage/platform calibration provided above accounts not only for errors deriving from inaccuracies in the X and Y direction measuring scales, but also accounts for inaccuracies along other axes, such as Abbe's error. This is because the apparatus and method of the present invention provides for error estimates at a plurality of points defined by rotation of a standard distance scale between the X and Y axes. In other words, the X - Y stage is "error-mapped" not only in the directions defined by the X and Y measuring scales but also in directions that do not coincide with the X and Y scale directions. This allows for accurate measurement of various distances between selected locations on magnetic tapes, which in turn makes possible a novel method for estimating error associated with head wheel rotation and error associated with other components or conditions within magnetic recording and reading machines.

Figure 10:
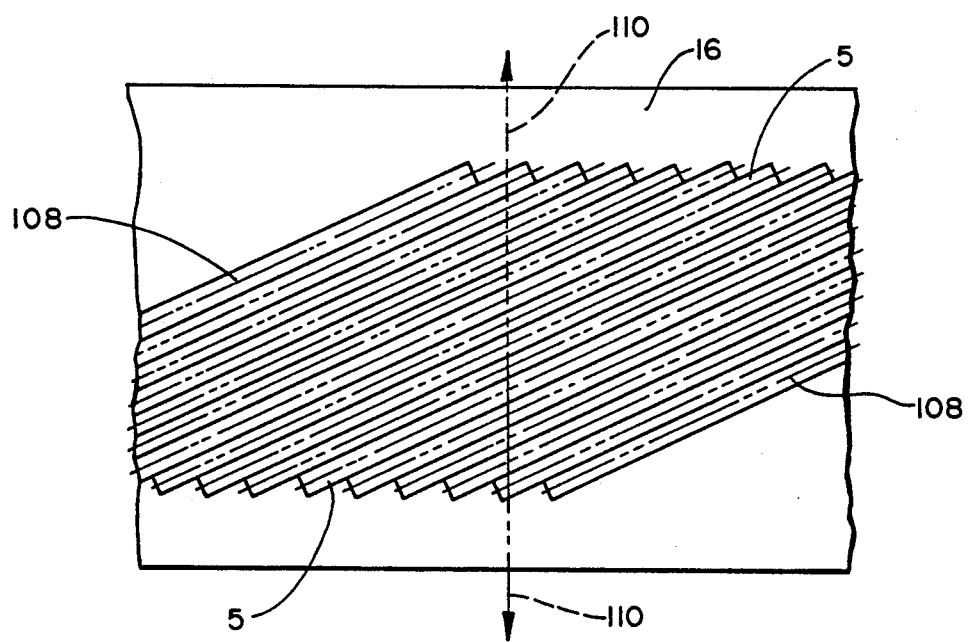
FIG. 10 is a schematic top plan view of a magnetic tape with representational track orientations.

Tracks written on magnetic tape may be visualized following treatment of the tape with magnetic developing fluid, i.e., immersing the tape in a solution of colloidal magnetic particles. As shown in FIG. 10, the distances between the center lines 108 of the tracks 5 in the cross-web direction 110 of tape 16 are accurately measured using the apparatus and methods for calibration as described above. For purposes of the following discussion, it is assumed that the head wheel of the magnetic recording and reading machine has four heads, each separated from its neighboring heads by an angle of 90°. Four adjacent tracks thereby represent one complete revolution of the head wheel. As will be apparent to those skilled in the art, however, the method described below is readily adaptable to other head wheel arrangements.

Results of the measurement of four adjacent tracks in the cross web direction as described above may take the following forms:

$$A_1 + B + M_{nom} = M_1 \\ A_2 + B + M_{nom} = M_2 \\ A_3 + B + M_{nom} = M_3 \\ A_4 + B + M_{nom} = M_4 \quad (4)$$

where $A_1$, $A_2$, $A_3$ and $A_4$ are errors due to head wheel rotation (rotational error), with $A_1$, $A_2$, $A_3$ and $A_4$ denoting rotational errors of four adjacent tracks representing four heads on a rotating head wheel, respectively; where B represents the error due to factors other than head wheel rotation (non-rotational error), which, for all practical purposes, may be assumed to be equal for two adjacent tracks; where $M_{nom}$ is the nominal distance between tracks as determined from the manufacturer's specification or by other means and where $M_1$, $M_2$, $M_3$, and $M_4$ are the measured distances in the cross-web direction between the centerlines of four adjacent tracks respectively.

Non-rotational errors in magnetic tape, such as distortion due to changes in temperature and humidity, generally will be manifested as gradual changes in track orientation over relatively long stretches of tape. With very narrow tracks and very small separations between adjacent tracks (e.g., center line-to-center line distances of about 12 micrometers or less), many thousands of tracks therefore will be encompassed by stretches of tape in which the non-rotational error changes very little. That is, all or nearly all of the thousands of tracks in such a region will reflect a constant or nearly constant non-rotationally based deviation from the "ideal" track orientation. As such, any two adjacent tracks, representing a very small spatial domain as well as a very short time domain (i.e, recorded only micro seconds or mini seconds apart) will reflect, for all practical purposes, identical nonrotational error characteristics. This provides the basis for the assumption given above that the non-rotational error B is considered equal for any two adjacent tracks.

Assuming the rotational error inherent in four adjacent tracks is a representation of the error encountered in a single revolution of the head wheel, a second assumption can be made with respect to the equations presented above: the sum of rotational errors in four adjacent tracks is equal to zero. For example, if the rotational error were due to a simple "out-of-round" (e.g., oval) condition of the head wheel, any positive deviation from circularity at a chosen point on the circumference of the head wheel will be compensated by a negative deviation from circularity at another point on the circumference of the head wheel. At the other extreme, rotational error due to an elevation or depression in only one sector of the head wheel surface (i.e., a "bump") also gives rise to rotational error that may be summed to zero over four adjacent tracks. This is because a simple adjustment to the baseline value will allow, for example, any positive deviation of a single track from the baseline to be compensated by the aggregate negative deviations of the other three tracks from the baseline.

Assuming the rotational error in a set of four tracks representing one rotation of the head wheel is equal to zero, the following additional equation is provided:

$$A_1 + A_2 + A_3 + A_4 = 0 \quad (5)$$

From equations (1), (2), (3), (4), and (5), the following matrix may be obtained:

$$A_1 - A_2 = M_1 - M_2 \\ A_2 - A_3 = M_2 - M_3 \\ A_3 - A_4 = M_3 - M_4 \\ A_1 + A_2 + A_3 + A_4 = 0$$

By solving the above matrix of four equations and four unknowns, the rotational errors $A_1$, $A_2$, $A_3$ and $A_4$ may be determined. Having identified the rotational errors, the non-rotational error B also may be determined by solving any one or more of equations (1)–(4). Random components of track errors and measurement errors may be excluded by repeating the above measurements at the same and different locations and averaging the results.

Having disclosed the subject matter of this invention, it should be apparent that many substitutions, modifications and variations of the invention are possible in light of the above teachings. It is therefore to be understood that the invention as taught and described herein is only limited to the extent of the breadth and scope of the appended claims.

What is claimed is:

1. A method for obtaining a corrected distance between two points on the recording surface of a magnetic tape, said recording surface being in generally parallel relationship with a generally planar measuring surface, said measuring surface having a first measuring scale in the X direction and a second measuring scale in the Y direction, said first and second measuring scales being collinear with X and Y lines, respectively, said X and Y lines intersecting at a point of origin, said measuring scales adapted to provide an X - Y coordinate reading for any of a plurality of points on said recording surface, comprising the steps of:

(1) providing measuring means for determining a measured distance between a first point on said recording surface corresponding to said point of origin and a second point on said recording surface, said measured distance determined by reference to said measuring scales;

(2) providing calibration means for determining a standard distance between said first point and said second point;

(3) determining an error parameter for said second point by determining the difference between said measured distance and said standard distance;

(4) determining error parameters for said plurality of points on said recording surface by repeating steps (1) through (3) for said plurality of points; and (5) measuring the distance between two points on said magnetic tape by using said measuring means to determine a measured distance between each of said two points and said point of origin, and applying respective ones of said error parameters to each of said two points to obtain a corrected distance between said two points.

2. The method of claim 1, wherein said error parameter at any point in said plurality of points is defined as:

$$E_{i,j} = R_{i,j}(\text{std}) - |\sqrt{X_i^2 + Y_j^2}| \tag{4}$$

where $E_{i,j}$ is said error parameter at said any point (i,j), $R_{i,j}$ is said standard distance from said point said X - Y coordinate reading at said point (i,j).

3. The method of claim 1, wherein said corrected distance is defined as:

$$d^*_{1,2} = \left( (d_1 + E_1)^2 + (d_2 + E_2)^2 - 2\left( \left(X_1 + E_1\frac{X_1}{d_1}\right)\left(X_2 + E_2\frac{X_2}{d_2}\right) + \left(Y_1 + E_1\frac{Y_1}{d_1}\right)\left(Y_2 + E_2\frac{Y_2}{d_2}\right) \right) \right)^{\frac{1}{2}} \tag{5}$$

where: $d^*_{1,2}$ is said corrected distance;
$d_1$, $d_2$ are said measured distances from each of said two points to said origin, respectively;
$E_1$, $E_2$ are said error parameters at each of said two points respectively; and
$X_1$, $X_2$, $Y_1$, $Y_2$ are said X - Y coordinate readings at each of said two points, respectively.

* * * * *

UNITED STATES PATENT AND TRADEMARK OFFICE
CERTIFICATE OF CORRECTION

PATENT NO. : 5,212,388
DATED : May 18, 1993
INVENTOR(S) : VALENTIN M. IZRAELEV

It is certified that error appears in the above-indentified patent and that said Letters Patent is hereby corrected as shown below:

Col. 2, line 54; "non-uniform" should read --nonuniform--;

Col. 9, line 36, "$R_{ij}$" should read --$R_{i,j}$--;

Col. 10, line 24, "at points and 2 respectively" should read --at points 1 and 2 respectively--;

IN THE CLAIMS:

Claim 2, line 2, Column 14,
"point said X - Y" should read
--point of origin to said any point (i,j) and where $X_i$ and $Y_j$ are said X - Y--.

Signed and Sealed this

Twenty-ninth Day of November, 1994

Attest:

BRUCE LEHMAN

*Attesting Officer*  *Commissioner of Patents and Trademarks*